(12) United States Patent  
Yeh (10) Patent No.: US 10,548,222 B1  
(45) Date of Patent: Jan. 28, 2020

(54) EMBEDDED PASSIVE DEVICE STRUCTURE (71) Applicant: FLEX TEK CO., LTD., Taoyuan (TW)

(72) Inventor: Tsung-Her Yeh, Taoyuan (TW)

(73) Assignee: FLEX TEK CO., LTD. (TW)

( * ) Notice: Subject to any disclaimer, the term of this patent is extended or adjusted under 35 U.S.C. 154(b) by 0 days.

(21) Appl. No.: 16/292,625

(22) Filed: Mar. 5, 2019

(30) Foreign Application Priority Data

Oct. 26, 2018 (TW) .............................. 107138036 A (51) Int. Cl.
*H05K 1/16* (2006.01)
*H05K 1/03* (2006.01)
*H05K 3/46* (2006.01)

(52) U.S. Cl.
CPC ............ *H05K 1/167* (2013.01); *H05K 1/0373* (2013.01); *H05K 3/4644* (2013.01); *H05K 1/162* (2013.01); *H05K 1/165* (2013.01); *H05K 2201/015* (2013.01); *H05K 2201/0158* (2013.01)

(58) Field of Classification Search
CPC ........... H05K 1/167; H05K 1/16; H01C 7/003
See application file for complete search history.

(56) References Cited

U.S. PATENT DOCUMENTS

2009/0071599 A1* 3/2009 Miyamoto ............. H05K 1/167  
    156/256  
2009/0139756 A1* 6/2009 Lee ........................ H05K 1/162  
    174/260

* cited by examiner

*Primary Examiner* — Jeremy C Norris (57) ABSTRACT

Disclosures of the present invention mainly describe an embedded passive device structure, constituted by a first electrically conductive layer, a resistor layer, a dielectric layer, a support layer, a joint layer, and a second electrically conductive layer. Particularly, it is able to form an electronic circuit topology comprising at least one thin film resistor, at least one thin film capacitor and at least one thin film inductor on the embedded passive device structure by applying two times of photolithography processes to the embedded passive device structure. In addition, the resistor layer, formed on the first electrically conductive layer through sputter-coating process, is made of Ni, Cr, W, or compound thereof so as to show the lowest resistance less than or equal to 5 Ω/sq because of having good film continuity and surface densification. Moreover, the use of sputter-coating technology is helpful in reduction of industrial waste water.

21 Claims, 10 Drawing Sheets

EMBEDDED PASSIVE DEVICE STRUCTURE

BACKGROUND OF THE INVENTION

1. Field of the Invention

The present invention relates to the technology field of embedded passive components, and more particularly to an embedded passive device structure comprising embedded thin film resistors, embedded thin film inductors and embedded thin film capacitors.

2. Description of the Prior Art

Engineers skilled in any one of technology of electronic engineering, computer engineering and electrical engineering certainly have the experience to make a circuit pattern (layout) on a printed circuit board (PCB) by themselves. There are several steps for making the circuit pattern on the PCB. First of all, it transfers a circuit layout from a substrate sheet to one surface of the PCB by lithography process. Subsequently, a developing process, an etching process and a stripping process are applied to the PCB in turns, so as to complete the fabrication of the circuit pattern on the PCB. Consequently, it is further disposed several pre-determined electronic chips and elements on the circuit pattern for constructing an electronic circuit topology on the PCB. The aforesaid pre-determined electronic chips and elements comprise amplifiers, microprocessor(s), resistors, capacitors, and inductors.

However, with the well development of various smart science and technologies, light weight, small size and thin thickness have become the fundamental characteristics of portable electronic devices. It is understood that, there is merely a limited space for disposing or arranging necessary PCB, electronic chips and elements in one portable electronic device having characteristics of small size and thin thickness, and that brings a major issue to both the electronics manufacturing plants and electronics assembly plants.

Accordingly, one solution developed by the electronics manufacturing plants is to continuously reduce the size of passive electronic components for use in the portable electronic devices. Nowadays, the passive electronic components having a specific size of 0805 (80×50 mil$^2$) are used in the manufacture of various mother boards, and the passive electronic components having a specific size of 0603 (60×30 mil$^2$) are used in the fabrication of conventionally-commercial laptop PCs. On the other hand, the passive electronic components having a specific size of 0402 (40×20 mil$^2$) are used in the manufacture of smart phones, and the passive electronic components having a specific size of 0201 (20×10 mil$^2$) are used in the production of commercial tablet PCs. It is extrapolated that, there may be a solid obstacle occurring on the road of continuously shrinking the size of the passive electronic components. For above reasons, technology for forming embedded passive components in a PCB is noticed again in recent years. For example, U.S. patent publication No. 2006/0286696 A1 has disclosed a passive electrical article.

Figure 1:
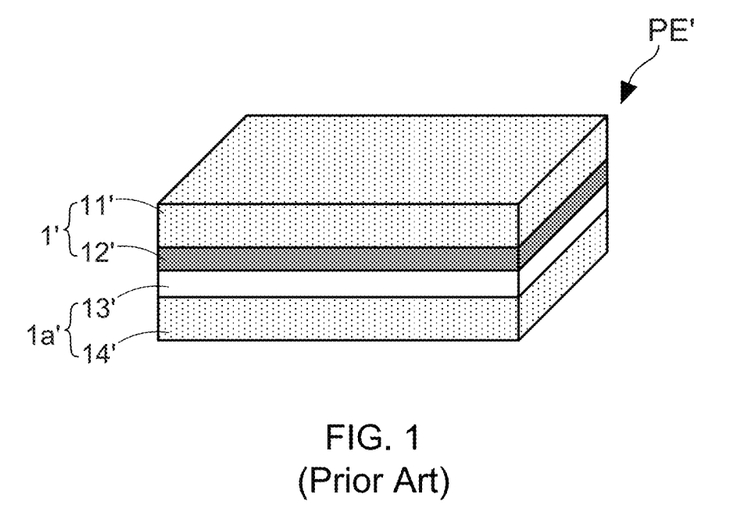
FIG. 1 shows a schematic cross-sectional diagram of a passive electrical article disclosed by U.S. patent publication No. 2006/0286696 A1.

FIG. 1 shows a schematic cross-sectional diagram of a passive electrical article disclosed by U.S. patent publication No. 2006/0286696 A1. From FIG. 1, it is understood that the passive electrical article PE' mainly comprises: a first laminated copper layer 11', a resistor layer 12', an insulation layer 13', and a second laminated copper layer 14', wherein the resistor layer 12' is made of a Ni—P compound, and the insulation layer 13' is a polymer layer having thickness in a range from 6 μm to 20 μm. The polymer layer is such as a polyimide (PI) layer. On the other hand, the first laminated copper layer 11' and the resistor layer 12' constitute a thin film resistor V. The said passive electrical article PE' can be manufactured by using following process steps:

(1) preparing a first laminated copper layer 11' having a specific thickness, and then forming a Ni—P compound layer (i.e., resistor layer 12') having thickness less than 1 μm on the first laminated copper layer 11' by electroplating, such that a thin film resistor 1' is therefore obtained;

(2) preparing a second laminated copper layer 14' having a specific thickness, and then forming a PI layer (i.e., insulation layer 13') on the second laminated copper layer 14', so as to obtain a thin film insulator 1a';

(3) combining the thin film insulator 1a' and the thin film resistor 1' by making the insulation layer 13' be attached onto the resistor layer 12', such that a passive electrical article PE' is consequently obtained.

Commonly, both the second laminated copper layer 14' and the first laminated copper layer 11' have a thickness of 36 μm, meaning that the passive electrical article PE' has a total thickness in a range between 79 μm and 93 μm. Herein, it needs to particularly note that, the thin film resistor 1' is conventionally fabricated by letting a resistor layer 12' be formed on a matt side of the first laminated copper layer 11'. Because the resistor layer 12' is made of Ni—P compound by using electroplating process, the electroplating waste certainly contain high-concentration P ingredient and induce an important issue of electroplating waste treatment. On the other hand, after using a bending test machine to complete a bending test of the passive electrical article PE' by using a ø4 mm roller, test results report that a stripping phenomenon starts to occur between the first laminated copper layer 11' and the resistor layer 12' after the passive electrical article PE' is bent over 40 times. Therefore, related experimental results have proved that, there is room for improvement in joint strength between the first laminated copper layer 11' and the resistor layer 12'.

It needs to further explain that, because the resistor layer 12' made of Ni—P compound has poor etching resistance against to commercial Cu etchant, it must apply three times of etching processes to the passive electrical article PE' in order to form necessary thin film resistors 1' on the identical passive electrical article PE'. After completing the three times of etching processes, thin film resistor components have good reliability can be formed on the passive electrical article PE' in the case of precisely meeting the requirements of a demanded line width and/or a length. However, owing to the fact that the resistor layer 12' of the thin film resistors 1' does not have good film continuity and surface densification, the electronic circuit having at least one resistor component, made on the passive electrical article PE' by using the photolithography process, commonly has a line width and a line pitch greater than 30 μm and 30 μm, respectively.

Figure 2:
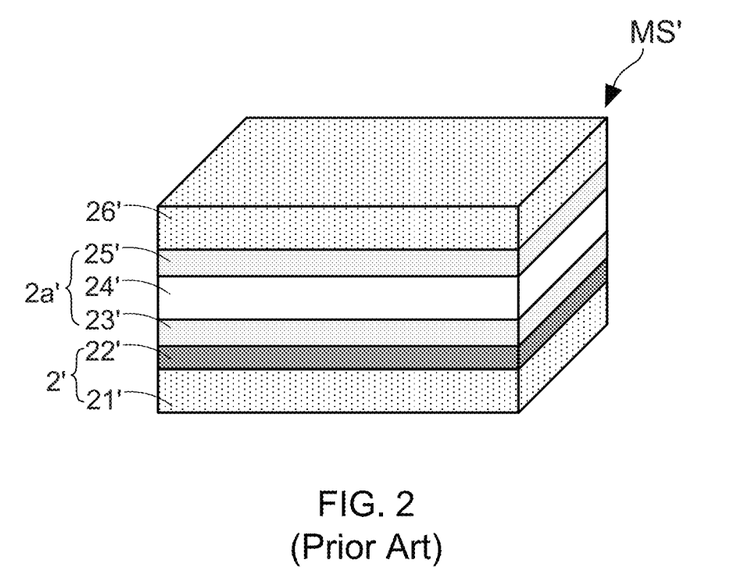
FIG. 2 shows a schematic cross-sectional diagram of multilayered construction for resistor and capacitor formation disclosed by U.S. Pat. No. 7,192,654.

In addition, U.S. Pat. No. 7,192,654 also disclosed a multilayered construction for resistor and capacitor formation. FIG. 2 shows a schematic cross-sectional diagram of the multilayered construction for resistor and capacitor formation disclosed by U.S. Pat. No. 7,192,654. The multilayered construction MS' comprises: a first laminated copper layer 21', a resistor layer 22', a first dielectric layer 23', an insulation layer 24', a second dielectric layer 25', and a second laminated copper layer 26', wherein the insulation layer 24' is made of polyimide (PI) and has a thickness in a range from 6 μm to 20 μm. Moreover, the first laminated copper layer 21' and the resistor layer 22' constitute a thin film resistor 2'. The multilayered construction MS' can be manufactured by using following process steps:

(1) preparing a first laminated copper layer 21' having a specific thickness, and then forming a Ni—P compound layer (i.e., resistor layer 22') having thickness less than 1 μm on the first laminated copper layer 21' by electroplating, such that a thin film resistor 2' is therefore obtained;

(2) preparing a PI layer (i.e., insulation layer 24'), a first dielectric layer 23', and a second dielectric layer 25', and then respectively attaching the first dielectric layer 23' and the second dielectric layer 25' onto the two surface of the PI layer, so as to obtain a dielectric insulator 2a';

(3) preparing a second laminated copper layer 26', and then applying a lamination process to the second laminated copper layer 26', the dielectric insulator 2a' and the thin film resistor 2', such that a multilayered construction MS' is consequently obtained.

In the multilayered construction MS', the resistor layer 22' of the thin film resistor 2' is attached to the first dielectric layer 23' of the dielectric insulator 2a'. Moreover, both the second laminated copper layer 26' and the first laminated copper layer 21' generally have a thickness of 36 μm, and the insulation layer 24' has a thickness in a range between 6 μm and 20 μm. Besides, both the first dielectric layer 23' and the second dielectric layer 25' have a thickness of 8 μm. Briefly speaking, the multilayered construction MS' has a total thickness in a range between 94 μm and 108 μm.

Herein, it needs to particularly note that, the thin film resistor 2' is conventionally fabricated by letting a resistor layer 22' be formed on a matt side of the first laminated copper layer 21'. Because the resistor layer 22' is made of Ni—P compound by using electroplating process, the electroplating waste certainly contain high-concentration P ingredient and induce an important issue of electroplating waste treatment. On the other hand, after using a bending test machine to complete a bending test of the multilayered construction MS' by using a ø4 mm roller, test results report that a stripping phenomenon starts to occur between the first laminated copper layer 21' and the resistor layer 22' after the passive electrical article PE' is bent over 40 times. Therefore, related experimental results have proved that, there is room for improvement in joint strength between the first laminated copper layer 21' and the resistor layer 22'.

From above descriptions, it is clear that how to improve or redesign the structure or composition of the passive electrical article PE' disclosed by U.S. patent publication No. 2006/0286696 A1 and/or the multilayered construction MS' disclosed by U.S. Pat. No. 7,192,654 has become an important issue. In view of that, inventors of the present application have made great efforts to make inventive research and eventually provided an embedded passive device structure.

SUMMARY OF THE INVENTION

The primary objective of the present invention is to provide an embedded passive device structure, comprising: a first electrically conductive layer, a resistor layer, a dielectric layer, a support layer, a joint layer, and a second electrically conductive layer. Particularly, it is able to form an electronic circuit topology comprising at least one thin film resistor, at least one thin film capacitor and at least one thin film inductor on the embedded passive device structure by applying two times of photolithography processes to the embedded passive device structure. In addition, the resistor layer, formed on the first electrically conductive layer through sputter-coating process, is made of Ni, Cr, W, or compound thereof so as to show the lowest resistance less than or equal to 5 Ω/sq because of having good film continuity and surface densification. Moreover, the use of sputter-coating technology is helpful in reduction of industrial waste water.

In order to achieve the primary objective of the present invention, the inventor of the present invention provides an embodiment for the embedded passive device structure, comprising:

a first electrically conductive layer;

a resistor layer, being formed on the first electrically conductive layer, and being made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials;

a dielectric layer, being connected to the resistor layer;

a support layer, being connected to the dielectric layer;

a joint layer, being connected to the support layer; and a second electrically conductive layer, being formed on the joint layer.

In the embodiment of the embedded passive device structure, both the first electrically conductive layer and the second electrically conductive layer are made of an electrically conductive material selected from the group consisting of silver (Ag), cooper (Cu), gold (Au), aluminum (Al), Ag-based compound, Cu-based compound, Au-based compound, Al-based compound, and a combination of two or more of the foregoing materials.

In the embodiment of the embedded passive device structure, the support layer is a flexible substrate or a solid substrate, and a manufacturing material for the support layer is selected from the group consisting of epoxy resin, melamine, polyimine, polyvinylidene fluoride, cyanoethyl amylopectin, benzocyclobutene, polynorbornene, polytetrafluoroethylene, acrylate, polyphenylene ether, cyanate, bis-maleimide triazine, allylated polyphenylene ether, and a combination of two or more of the foregoing materials. It needs to further explain that, judgment criteria for determining whether the support layer is one flexible substrate or one solid substrate is substrate thickness. Once the substrate thickness is greater than 200 μm, it is difficult for the support layer to show flexibility even if the support layer is made of any one of foregoing manufacturing material. In such case, the support layer is regarded as a solid substrate.

In the embodiment of the embedded passive device structure, the resistor layer is formed on the first electrically conductive layer through a sputtering process.

In the embodiment of the embedded passive device structure, the dielectric layer comprises a polymer matrix and a plurality of dielectric particles doped in or enclosed by the polymer matrix, and a manufacturing material for the dielectric particles be selected from the group consisting of high-dielectric material, medium-dielectric material and low-dielectric material. Moreover, the dielectric layer is made by using a sputtering process so as to have a perovskite structure or a spinel structure, and there is a trace element additive contained in the dielectric layer; wherein the trace element additive is selected from the group consisting of lanthanide element, actinide element, rare earth element, and alkaline earth element. The use of the trace element additive is helpful for making the dielectric layer exhibit a specific property of low K, high K, or high Q through adjusting the number of donners and/or accepters in the dielectric layer.

In the embodiment of the embedded passive device structure, the Ni-based alloy is selected from the group consisting of $Ni_{1-x}Cr_x$, $Ni_{1-x-y}Cr_xM_y$, $N_{1-x}W_x$, and $Ni_{1-x-y}W_xM_y$, wherein M is metal element.

In the embodiment of the embedded passive device structure, he Ni-based compound is selected from the group consisting of $Ni_{1-x-z}Cr_xN_z$ and $Ni_{1-x-y}W_xN_z$, wherein N is nonmetallic element.

In the embodiment of the embedded passive device structure, the Cr-based alloy is selected from the group consisting of $Cr_{1-x}W_x$ and $Cr_{1-x-y}W_xM_y$, wherein M is metal element.

In the embodiment of the embedded passive device structure, the Cr-based compound is selected from the group consisting of $Cr_{1-x-z}W_xN_z$, wherein N is nonmetallic element.

In the embodiment of the embedded passive device structure, the W-based alloy is selected from the group consisting of $W_{1-x}Cr_x$ and $W_{1-x-y}Cr_xM_y$, wherein M is metal element.

In the embodiment of the embedded passive device structure, the W-based compound is selected from the group consisting of $W_{1-x-z}Cr_xN_z$, wherein N is nonmetallic element.

In the embodiment of the embedded passive device structure, M is selected from the group consisting of cooper (Cu), molybdenum (Mo), vanadium (V), tungsten (W), iron (Fe), aluminum (Al), and titanium (Ti), and N is selected from the group consisting of boron (B), carbon (C), nitrogen (N), oxygen (O), and silicon (Si).

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe an embedded passive device structure according to the present invention, embodiments of the present invention will be described in detail with reference to the attached drawings hereinafter.

Constitution of the Embedded Passive Device Structure

Figure 3:
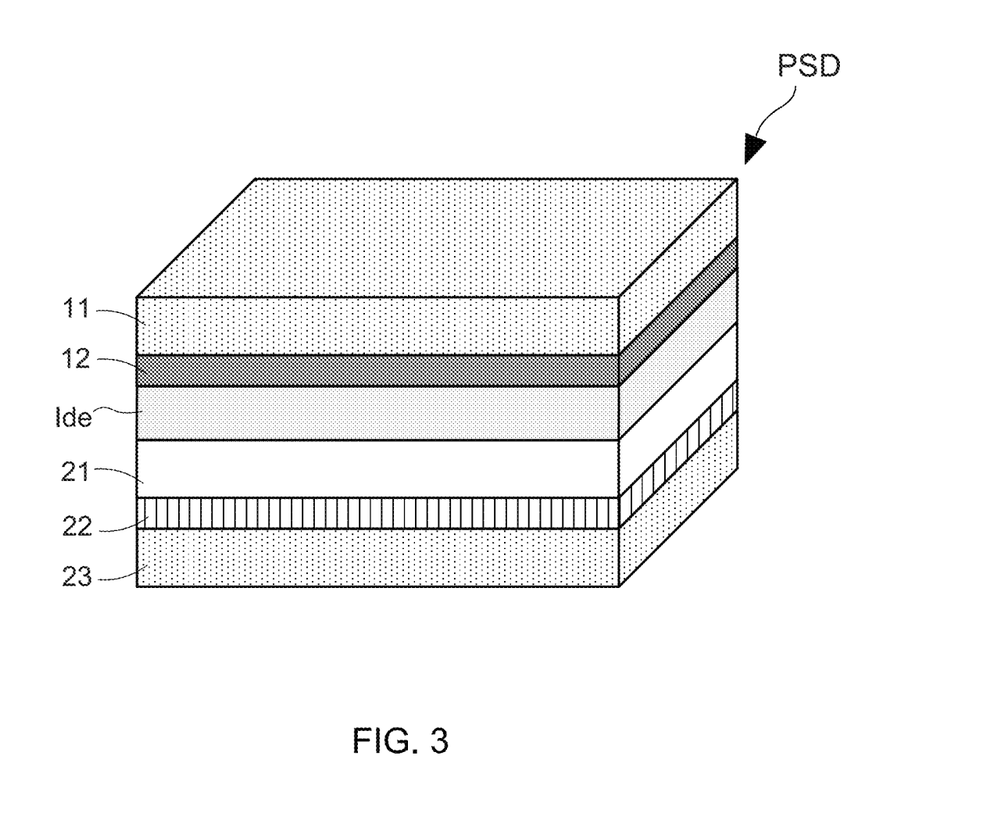
FIG. 3 shows a schematic stereo diagram of an embedded passive device structure according to the present invention.

With reference to FIG. 3, there is shown a schematic stereo diagram of an embedded passive device structure according to the present invention. As FIG. 3 shows, the embedded passive device structure PSD comprises: a first electrically conductive layer 11, a resistor layer 12, a dielectric layer Ide, a support layer 21, a joint layer 22, and a second electrically conductive layer 23. Both the first electrically conductive layer 11 and the second electrically conductive layer 23 have a thickness in a range from 0.4 μm to 50 μm, and are made of an electrically conductive material selected from the group consisting of silver (Ag), cooper (Cu), gold (Au), aluminum (Al), Ag-based compound, Cu-based compound, Au-based compound, Al-based compound, and a combination of two or more of the foregoing materials.

From FIG. 3, it is understood that the resistor layer 12 is formed on the first electrically conductive layer 11 and has a thickness thinner than 2 μm. The first electrically conductive layer 11 is commonly made of copper (Cu), and the resistor layer 12 is formed on the first electrically conductive layer 11 through a sputtering process. Of course, for the purpose of shrinking the processing time of the resistor layer 12, it is able to form one portion of the resistor layer 12 on the copper layer (i.e., the first electrically conductive layer 11) via electroplating process, and then complete the fabrication of other portions of the resistor layer 12 through the sputter-coating process. Herein, it must particularly emphasize that, the resistor layer 12 formed on the copper layer through sputter-coating process shows the lowest resistance less than or equal to 5 Ω/sq because of having better film compactness and continuity. In the present invention, a manufacturing material for the joint layer is selected from the group consisting of Ni, Cr, W, Ni-based compound, Cr-based compound, W-based compound, Ni-based alloy, Cr-based alloy, and W-based alloy. On the other hand, exemplary materials for making the resistor layer 12 are listed in following Table (1).

TABLE (1)

| Types of the resistor layer | Corresponding exemplary material |
|---|---|
| Ni-based compound | $Ni_{1-x-z}Cr_xN_z$ or $N_{1-x-y}W_xN_z$ |
| W-based compound | $W_{1-x-z}Cr_xN_z$ |
| Ni-based alloy | $Ni_{1-x}Cr_x$, $Ni_{1-x-y}Cr_xM_y$, $N_{1-x}W_x$, or $Ni_{1-x-y}W_xM_y$ |
| W-based alloy | $W_{1-x}Cr_x$ or $W_{1-x-y}Cr_xM_y$ |

All the x, y, and z are atomic ratio, and x+y+z=1. Moreover, M is metal element and selected from the group consisting of cooper (Cu), molybdenum (Mo), vanadium (V), tungsten (W), iron (Fe), aluminum (Al), and titanium (Ti). On the other hand, N is nonmetallic element and selected from the group consisting of cooper (Cu), molybdenum (Mo), vanadium (V), tungsten (W), iron (Fe), aluminum (Al), and titanium (Ti).

In addition, the dielectric layer Ide is connected to the resistor layer 12, and the support layer 21 is connected to the dielectric layer Ide. In the present invention, the dielectric layer Ide has a thickness in a range from 0.01 μm to 50 μm, and the support layer 21 has a thickness in a range between 5 μm and 350 μm. In general, the dielectric layer Ide comprises a polymer matrix and a plurality of dielectric particles doped in or enclosed by the polymer matrix, and a manufacturing material for the dielectric particles be selected from the group consisting of high-dielectric material, medium-dielectric material and low-dielectric material. Moreover, the dielectric layer Ide is made by using a sputtering process so as to have a perovskite structure or a spinel structure, and there is a trace element additive contained in the dielectric layer Ide. The trace element additive is selected from the group consisting of lanthanide element, actinide element, rare earth element, and alkaline earth element. It is worth explaining that, the use of the trace element additive is helpful for making the dielectric layer Ide exhibit a specific property of low K, high K, or high Q through adjusting the number of donners and/or accepters in the dielectric layer Ide. On the other hand, exemplary materials for making dielectric layer Ide are listed in following Table (2).

TABLE (2)

| Materials | Corresponding exemplary material |
| --- | --- |
| High-K dielectric particles | $BaTiO_3$, $BaZrO_3$, $HfO_2$, $Y_2O_3$, doped $BaTiO_3$ (e.g., La-doped $BaTiO_3$), etc. |
| Dielectric particles | $SiO_2$ |
| Low-K dielectric particles | Polyimide (PI), polyaryletherketone (PAEK), aromatic thermoset (SiLK), fluorinated $SiO_2$ (SiOF), Polynorbornene, foamed polypropylene-resin, air gap structure, etc. |
| High-Q dielectric particles | Material having properties of high Q and high K: $Mg_2SiO_4$. Material having properties of high Q and low K: $(Ba_{1-x}Al_x)TiO_3$. |

Moreover, the support layer 21 is a flexible substrate or a solid substrate made of glass fiber. A manufacturing material for the support layer 21 IS selected from the group consisting of epoxy resin, melamine, polyimine, polyvinylidene fluoride, cyanoethyl amylopectin, benzocyclobutene, polynorbornene, polytetrafluoroethylene, acrylate, polyphenylene ether, cyanate, bismaleimide triazine, allylated polyphenylene ether, and a combination of two or more of the foregoing materials. It needs to further explain that, judgment criteria for determining whether the support layer 21 is one flexible substrate or one solid substrate is substrate thickness. Once the substrate thickness is greater than 200 μm, it is difficult for the support layer 21 to show flexibility even if the support layer 21 is made of any one of foregoing manufacturing material. In such case, the support layer 21 is regarded as a solid substrate. On the other hand, the joint layer 22 is connected to the support layer 21, and has a thickness thinner than 2 μm. In the present invention, a manufacturing material for the joint layer 22 is selected from the group consisting of Ni, Cr, W, Ni-based compound, Cr-based compound, W-based compound, Ni-based alloy, Cr-based alloy, and W-based alloy. Exemplary materials for making the joint layer 22 can refer to above-presented Table (1). In addition, the joint layer 22 can also be made of Ni—Cu alloy, Ni—Ti alloy, Cu—Ti alloy, or Cr—Ni alloy.

First Method for Making the Embedded Passive Device Structure

Figure 4:
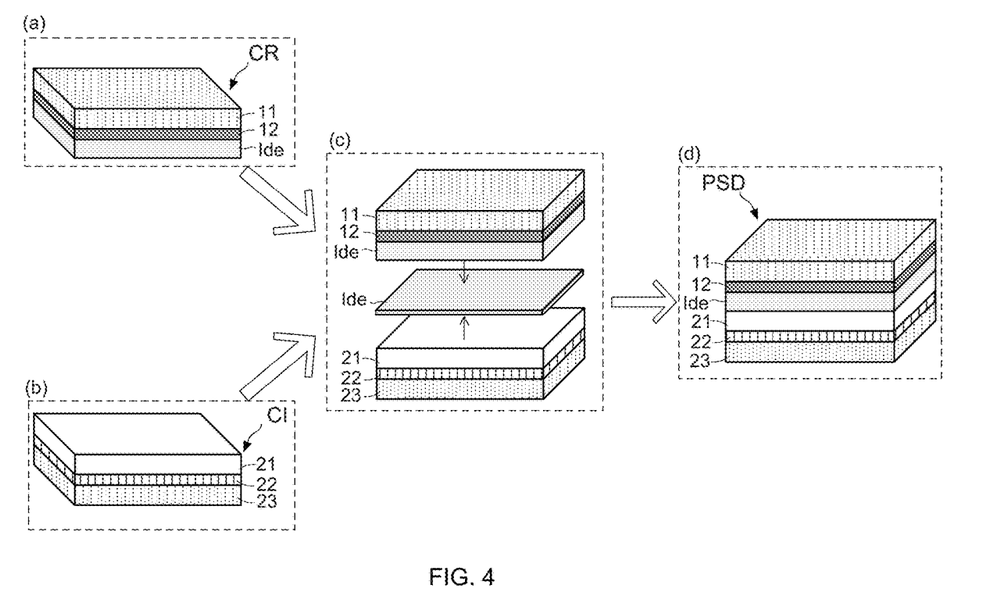
FIG. 4 shows a schematic manufacturing process flow of the embedded passive device structure.

Referring to FIG. 3 again, and please simultaneously refer to FIG. 4, which illustrates a schematic manufacturing process flow of the embedded passive device structure. The first method for making the embedded passive device structure PSD of the present invention comprises several process steps. First of all, as diagram (a) in FIG. 4 shows, a resistor layer 12 is formed on one surface of a dielectric layer Ide through sputtering process, and a first electrically dielectric conductive layer 11 is formed on the resistor layer 12, such that a thin film resistor CR is obtained. Subsequently, as diagram (b) in FIG. 4 shows, a joint layer 22 is formed on one surface of a support layer 21 through sputter-coating process, and a second electrically conductive layer 23 is formed on the joint layer 22 via through sputter-coating process, so as to obtain a thin film insulator CI. Consequently, as diagrams (c) and (d) in FIG. 4 show, the thin film insulator CI and the thin film resistor CR are combined together by making the support layer 21 be attached to the dielectric layer Ide, such that the embedded passive device structure PSD of the present invention is therefore obtained. It is worth noting that, there is an extra dielectric layer Ide disposed between the support layer 21 of the thin film insulator CI and the dielectric layer Ide of the thin film resistor CR, wherein this extra dielectric layer Ide is adopted for adjusting a total thickness of the dielectric layer Ide.

Second Method for Making the Embedded Passive Device Structure

Figure 5:
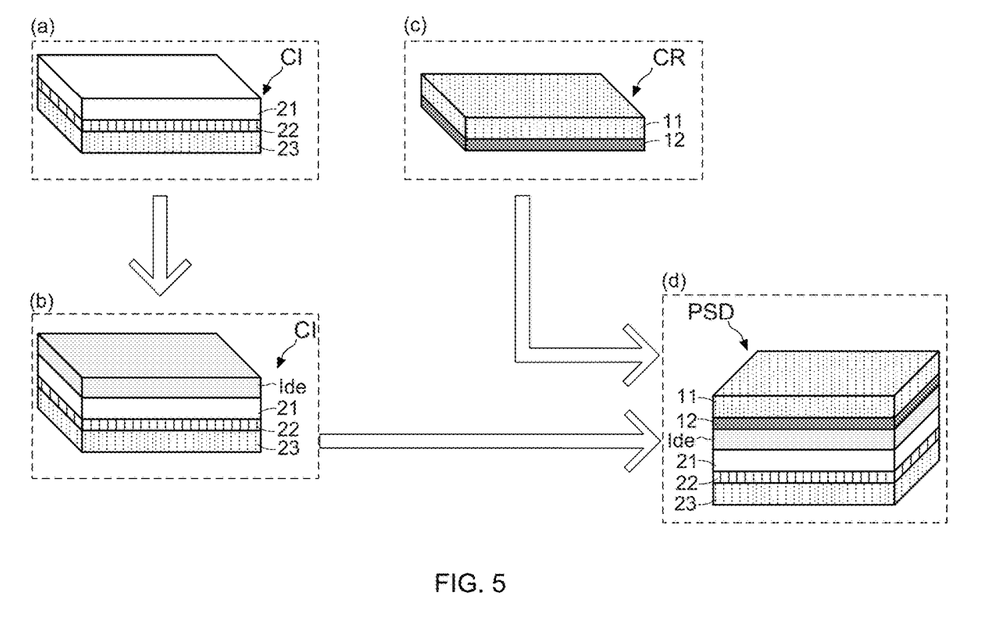
FIG. 5 shows a schematic manufacturing process flow of the embedded passive device structure.

Referring to FIG. 3 again, and please simultaneously refer to FIG. 5, which illustrates a schematic manufacturing process flow of the embedded passive device structure. The second method for making the embedded passive device structure PSD of the present invention comprises several process steps. First of all, as diagram (a) in FIG. 5 shows, a joint layer 22 is formed on one surface of a support layer 21 through sputtering process, and a second electrically dielectric conductive layer 23 is subsequently formed on the joint layer 22, such that a thin film insulator CI is obtained. Subsequently, as diagram (b) in FIG. 5 shows, a dielectric layer Ide is formed on another one surface of a support layer 21. It needs to particularly explain that, thickness of the dielectric layer Ide can be precisely adjusted and defined through this process step. Next, as diagram (c) in FIG. 5 shows, a resistor layer 12 is formed on one surface of a first electrically conductive layer 11 through sputtering process, so as to obtain a thin film resistor CR. Consequently, as diagram (d) in FIG. 5 shows, the thin film insulator CI and the thin film resistor CR are combined together by making the resistor layer 12 be attached to the dielectric layer Ide, such that the embedded passive device structure PSD of the present invention is therefore obtained. Herein, it is worth explaining that, there are no bubbles or un-uniform joint occurring at the junction of the resistor layer 12 of the thin film resistor CRI and the dielectric layer Ide of the thin film insulator CI because the thickness of the dielectric layer Ide has been properly adjusted.

Application of the Embedded Passive Device Structure

Figure 6A:
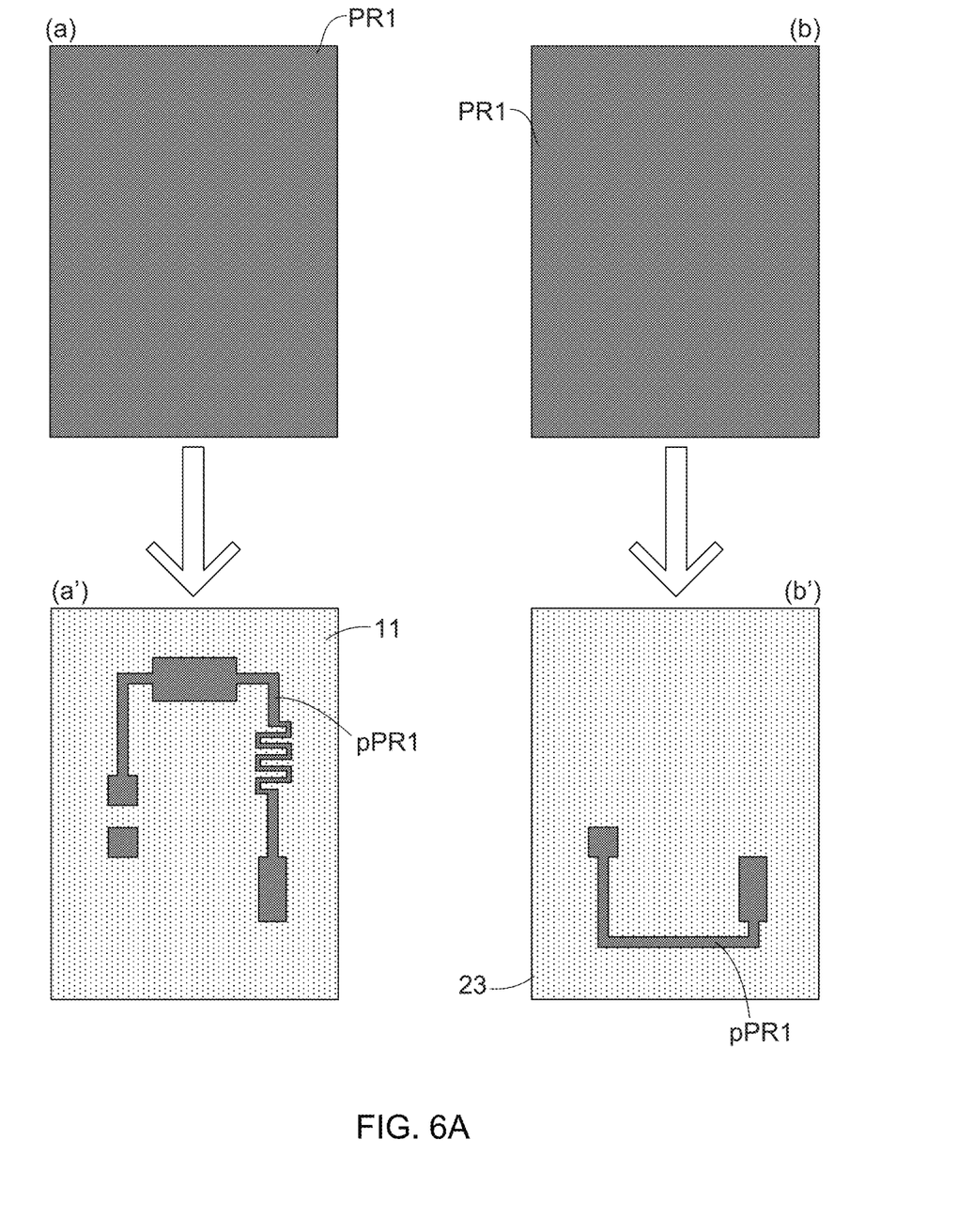
FIG. 6A shows a diagram for describing photolithography processes of the embedded passive device structure.

FIG. 6A, FIG. 6B, FIG. 6C, and FIG. 6D show diagrams for describing photolithography processes of the embedded passive device structure. Particularly, it is able to form an electronic circuit topology comprising at least one thin film resistor, at least one thin film capacitor and at least one thin film inductor on the embedded passive device structure PSD by applying two times of photolithography processes to the embedded passive device structure PSD. During first-time photolithography process, as diagrams (a) and (b) show in FIG. 6A show, a first photoresistor PR1 is formed on both the first electrically conductive layer 11 and the second electrically conductive 23, and then a patterned first photoresistor pPR1 is made on the first electrically conductive layer 11 and the second electrically conductive 23 showing as shown as diagrams (a') and (b') in FIG. 6A.

Figure 6B:
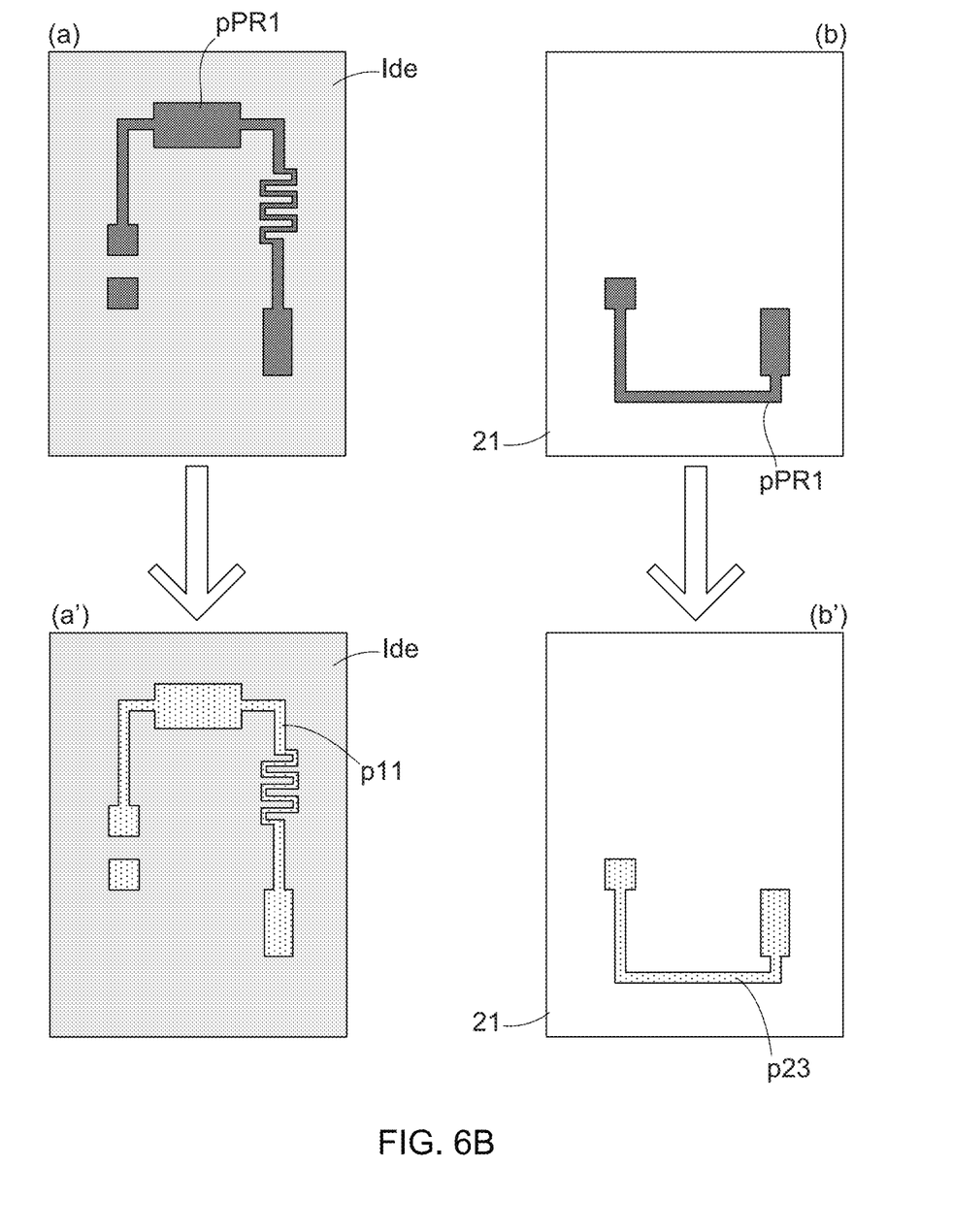
FIG. 6B shows a diagram for describing photolithography processes of the embedded passive device structure.

Subsequently, as diagrams (a) and (b) of FIG. 6B show, etching process is applied to remove a portion of the first electrically conductive layer 11 and a portion of the resistor layer 12 which are not covered by the first patterned photoresistor pPR1, and simultaneously remove a portion of the second electrically conductive layer 23 and a portion of the joint layer 22 which are not covered by the first patterned photoresistor pPR1. Consequently, as diagrams (a') and (b') in FIG. 6B show, a patterned first electrically conductive layer p11 and a patterned second electrically conductive layer p23 are respectively formed the dielectric layer Ide and the support layer 21 after the first patterned photoresistor pPR1 is removed.

Figure 6C:
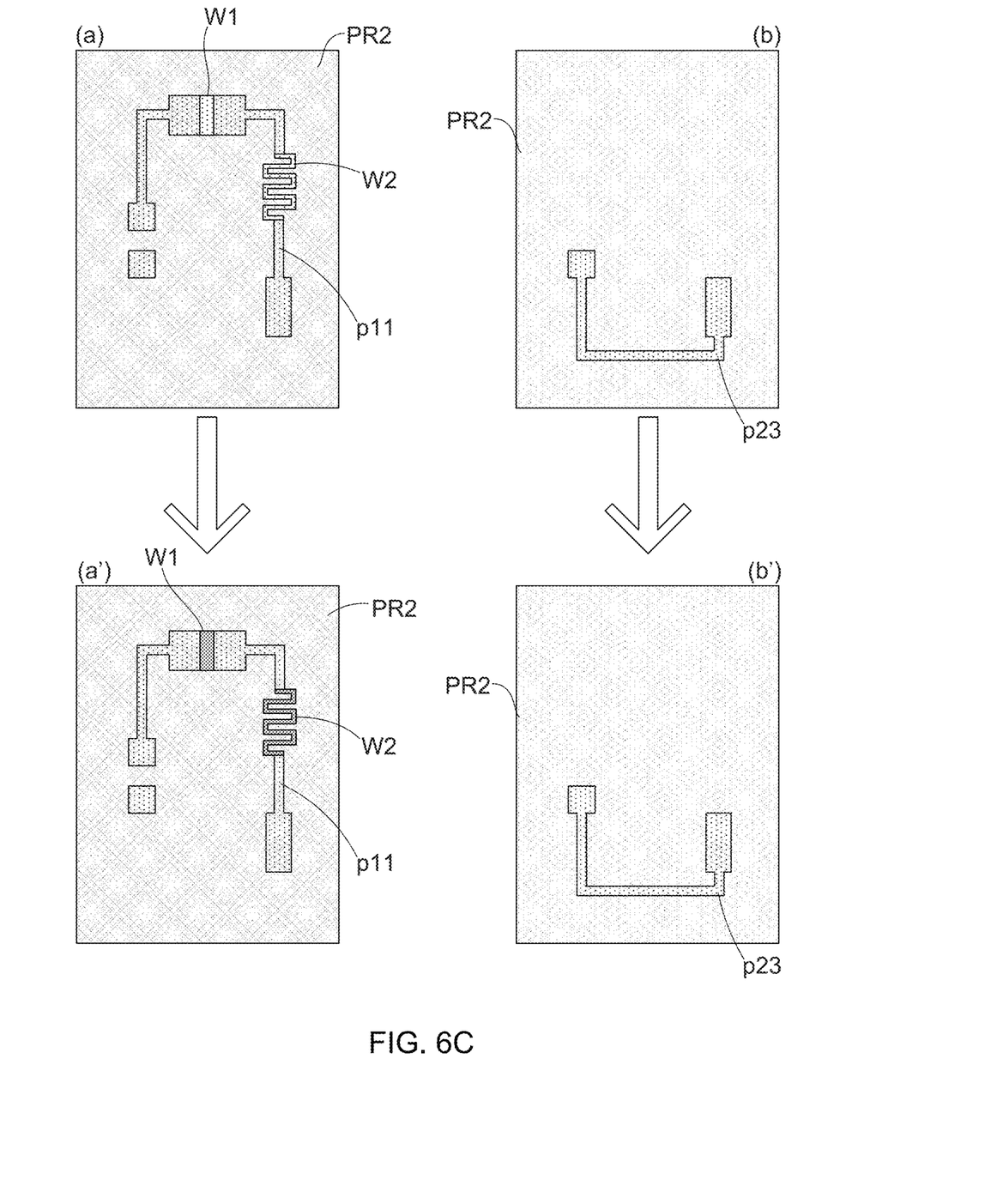
FIG. 6C shows a diagram for describing photolithography processes of the embedded passive device structure.

During second-time photolithography process, as diagrams (a) and (b) in FIG. 6C show, a second photoresistor PR2 is formed on both the patterned first electrically conductive layer p11 and the dielectric layer Ide, and the second photoresistor PR2 is also formed on both the patterned second electrically conductive layer p23 and the support layer 21. However, it is worth noting that, the second photoresistor PR2 shown in FIG. 6C is presented by a transparent form in order to let the variations of the patterned first electrically conductive layer p11 and the patterned second electrically conductive layer p23 be seen during the execution of following process steps. In addition, there are a first opening W1 and a second opening W2 provided on the second patterned photoresistor PR2.

Figure 6D:
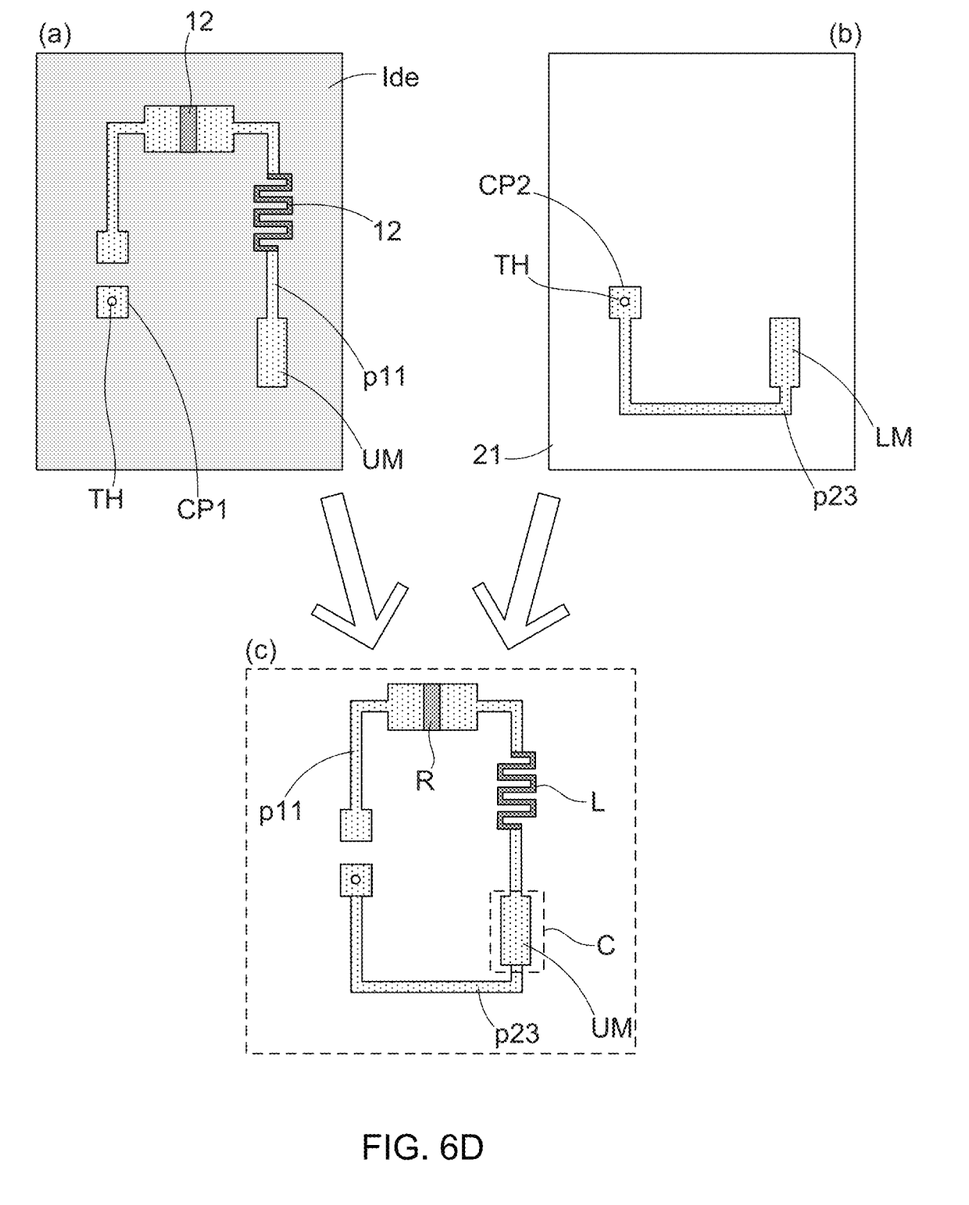
FIG. 6D shows a diagram for describing photolithography processes of the embedded passive device structure.

Subsequently, as diagrams (a') and (b') of FIG. 6D show, etching process is applied to remove a portion of the first patterned electrically conductive layer p11 and a portion of the second patterned electrically conductive layer p23 which are not covered by the second photoresistor PR2. Consequently, as diagrams (a) and (b) in FIG. 6D show, a first electronic circuit comprising the first patterned electrically conductive layer p11 is formed on the dielectric layer Ide, and a second electronic circuit comprising the second patterned electrically conductive layer p23 is formed on the support layer 21. Furthermore, it is able to make a through hole TH at a first contact point CP1 of the first electronic circuit through laser etching process, so as to make the first contact point CP1 connects to a second contact point CP2 of the second electronic circuit via the through hole TH.

From FIG. 6D, it is understood that the first electronic circuit contains one thin film resistor R, one thin film inductor L and an upper metal plate UM. Moreover, the second electronic circuit contains a lower metal plate LM, such that the upper metal plate UM, the lower metal plate LM, and the dielectric layer Ide and the support layer 21 clamped between the upper metal plate UM and the lower metal plate LM constituted a thin film capacitor C. Therefore, diagrams of FIG. 6A, FIG. 6B, FIG. 6C, and FIG. 6D have exemplarily showed that, it is able to form an electronic circuit topology comprising at least one thin film resistor, at least one thin film capacitor and at least one thin film inductor on the embedded passive device structure PSD by applying two times of photolithography processes to the embedded passive device structure PSD.

EXPERIMENT

Figure 7:
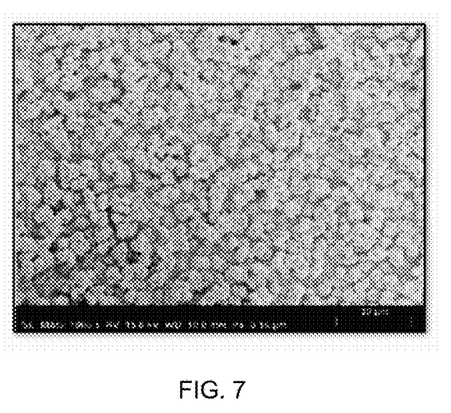
FIG. 7 shows an EBSD image of the passive electrical article disclosed by U.S. patent publication No. 2006/0286696 A1.
Figure 8:
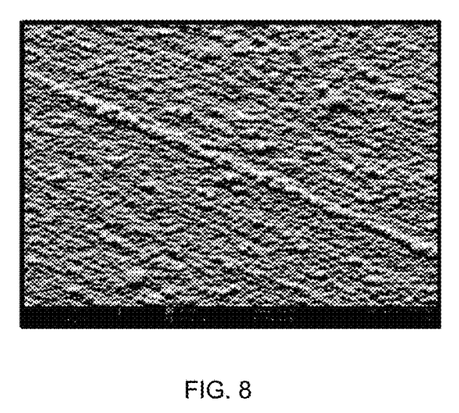
FIG. 8 shows an EBSD image of the embedded passive device structure.

For proving the embedded passive device structure PSD (as shown in FIG. 5) of the present invention can indeed exhibit outstanding properties superior than that of the passive electrical article PE' (as shown in FIG. 1) disclosed by U.S. patent US2006/0286696 A1, inventors of the present invention have made related samples of the embedded passive device structure PSD and the passive electrical article PE'. FIG. 7 shows an EBSD (electron back-scattered diffraction) image of the passive electrical article disclosed by U.S. patent publication No. 2006/0286696 A1, and FIG. 8 shows an EBSD image of the embedded passive device structure. The resistor layer 12' made of Ni—P compound by using electroplating process commonly show the drawbacks of film discontinuity and high surface roughness, and these drawbacks further lead the thin film resistor 1' made on the passive electrical article PE' to exhibit higher surface resistance (electrical characteristics) and poor bending and stretching characteristics (mechanical characteristics). Moreover, from FIG. 7, it is observed that the resistor layer 12' made by using electroplating process indeed shows the drawbacks of film discontinuity and high surface roughness. On the contrary, from FIG. 8, it is observed that the resistor layer 12 (i.e., the $Ni_{0.97}Cr_{0.03}$ layer) is formed on the copper foil (i.e., the first electrically conductive layer 11) through sputter-coating process, that makes the $Ni_{0.97}Cr_{0.03}$ layer shows the lowest resistance less than or equal to 5 Ω/sq because of having good film continuity and surface densification.

Figure 9:
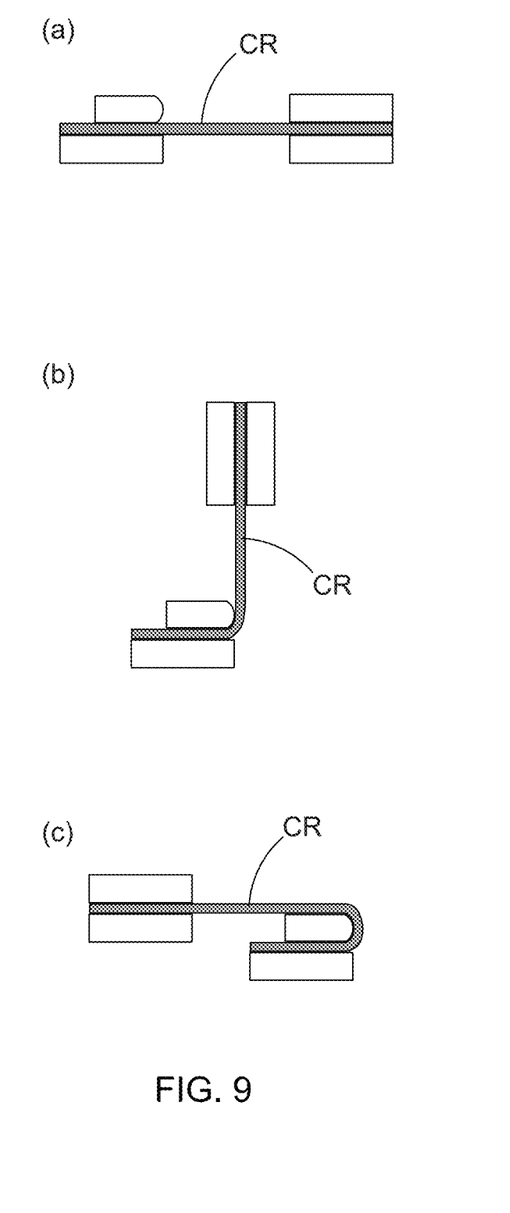
FIG. 9 shows a schematic diagram for depicting a process flow of a bending test applied to the embedded passive device structure.

FIG. 9 shows a schematic diagram for depicting a process flow of a bending test applied to the embedded passive device structure. There are two bending tests applied to the copper film 1 proposed by the present invention. In first bending test, diagrams (a) and (b) depict that a bending test machine is used to bend the thin film resistor CR of the embedded passive device structure PSD from 0 degree to 90 degree by using a ø4 mm roller. Moreover, diagrams (b) and (c) further depict that the bending test machine is continuously used to bend the thin film resistor CR from 90 degree to 180 degree by using the ø4 mm roller.

Please refer to FIG. 9 again. In second bending test, diagrams (a) and (b) depict that a bending test machine is used to bend the thin film resistor CR of the embedded passive device structure PSD from 0 degree to 90 degree by using a ø8 mm roller. Moreover, diagrams (b) and (c) further depict that the bending test machine is continuously used to bend the thin film resistor CR from 90 degree to 180 degree by using the ø8 mm roller. Experimental data of the two bending tests are integrated in following Table (3).

TABLE (3)

| Test items | Resistance of the resistor layer (i.e., the $Ni_{0.97}Cr_{0.03}$ layer) (ohm) | |
|---|---|---|
| | Measured before the bending test | Measured after the thin film resistor CR has been bent for 1000 times |
| First bending test (ø4 mm bending diameter) | 125 | 125 |
| Second bending test (ø8 mm bending diameter) | 123 | 123 |

Therefore, test results of Table (3) report that, by forming the resistor layer 12 onto the copper foil (i.e., the first electrically conductive 11) through sputter-coating process, the copper foil and the resistor layer 12 made of metal, metal alloy or metal compound certainly have strong joint strength between each other. Therefore, it is understood that the thin film resistor CR of the present invention should have an excellent reliability.

Therefore, above descriptions have described the embedded passive device structure completely and clearly; in summary, the present invention includes the advantages of:

(1) In the present invention, an embedded passive device structure PSD comprising a first electrically conductive layer 11, a resistor layer 12, a dielectric layer Ide, a support layer 21, a joint layer 22, and a second electrically conductive layer 23 is proposed. Particularly, it is able to form an electronic circuit topology comprising at least one thin film resistor, at least one thin film capacitor and at least one thin film inductor on the embedded passive device structure PSD by applying two times of photolithography processes to the embedded passive device structure PSD.

(2) In addition, the resistor layer 12, formed on the first electrically conductive layer 11 through sputter-coating process, is made of Ni, Cr, W, or compound thereof so as to show the lowest resistance less than or equal to 5 Ω/sq because of having good film continuity and surface densification. Moreover, the use of sputter-coating technology is helpful in reduction of industrial waste water.

(3) Moreover, experimental data of two bending tests have reported that, by forming the resistor layer 12 onto the copper foil (i.e., the first electrically conductive 11) through sputter-coating process, the copper foil and the resistor layer 12 made of metal, metal alloy or metal compound certainly have strong joint strength between each other. Therefore, it is understood that the thin film resistor CR of the embedded passive device structure PSD have an excellent reliability.

(4) Since the resistor layer 12 of the thin film resistor CR of the embedded passive device structure PSD has good film continuity and surface densification, the electronic circuit, made on the embedded passive device structure PSD by using the photolithography process, can be easily controlled to has a line width and a line pitch smaller than 10 μm and 10 μm and, respectively.

The above description is made on embodiments of the present invention. However, the embodiments are not intended to limit scope of the present invention, and all equivalent implementations or alterations within the spirit of the present invention still fall within the scope of the present invention.

What is claimed is:

1. An embedded passive device structure, comprising:
   a first electrically conductive layer;
   a resistor layer, being formed on the first electrically conductive layer, and being made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials;
   a dielectric layer, being connected to the resistor layer;
   a support layer, being connected to the dielectric layer;
   a joint layer, being connected to the support layer; and
   a second electrically conductive layer, being formed on the joint layer.

2. The embedded passive device structure of claim 1, wherein both the first electrically conductive layer and the second electrically conductive layer are made of an electrically conductive material selected from the group consisting of silver (Ag), cooper (Cu), gold (Au), aluminum (Al), Ag-based compound, Cu-based compound, Au-based compound, Al-based compound, and a combination of two or more of the foregoing materials.

3. The embedded passive device structure of claim 1, wherein the both first electrically conductive layer and the second electrically conductive layer have a thickness in a range from 0.4 μm to 50 μm.

4. The embedded passive device structure of claim 1, wherein both the resistor layer and the joint layer have a thickness thinner than 2 μm.

5. The embedded passive device structure of claim 1, wherein the resistor layer is formed on the first electrically conductive layer through a sputtering process.

6. The embedded passive device structure of claim 1, wherein the dielectric layer is formed on the support layer through a sputtering process or a coating process.

7. The embedded passive device structure of claim 1, wherein the dielectric layer is formed on the resistor layer through a sputtering process or a coating process.

8. The embedded passive device structure of claim 1, wherein the dielectric layer has a thickness in a range from 0.01 μm to 50 μm, and the support layer having a thickness in a range between 5 μm and 350 μm.

9. The embedded passive device structure of claim 1, wherein the dielectric layer comprises a polymer matrix and a plurality of dielectric particles doped in or enclosed by the polymer matrix, and a manufacturing material for the dielectric particles be selected from the group consisting of high-dielectric material, medium-dielectric material and low-dielectric material.

10. The embedded passive device structure of claim 1, wherein the dielectric layer is made by using a sputtering process so as to has a perovskite structure or a spinel structure, and there being a trace element additive contained in the dielectric layer; wherein the trace element additive is selected from the group consisting of lanthanide element, actinide element, rare earth element, and alkaline earth element.

11. The embedded passive device structure of claim 1, wherein the support layer is a flexible substrate, and a manufacturing material for the support layer being selected from the group consisting of epoxy resin, melamine, polyimine, polyvinylidene fluoride, cyanoethyl amylopectin, benzocyclobutene, polynorbornene, polytetrafluoroethylene, acrylate, polyphenylene ether, cyanate, bismaleimide triazine, allylated polyphenylene ether, and a combination of two or more of the foregoing materials.

12. The embedded passive device structure of claim 1, wherein the support layer is a solid substrate made of glass fiber.

13. The embedded passive device structure of claim 1, wherein a manufacturing material for the joint layer is selected from the group consisting of Ni, Cr, W, Ni-based compound, Cr-based compound, W-based compound, Ni-based alloy, Cr-based alloy, and W-based alloy.

14. The embedded passive device structure of claim 13, wherein the Ni-based alloy is selected from the group consisting of $Ni_{1-x}Cr_x$, $Ni_{1-x-y}Cr_xM_y$, $N_{1-x}W_x$, and $Ni_{1-x-y}W_xM_y$, wherein M is metal element.

15. The embedded passive device structure of claim 14, wherein the Cr-based alloy is selected from the group consisting of $Cr_{1-x}W_x$ and $Cr_{1-x-y}W_xM_y$, wherein M is metal element.

16. The embedded passive device structure of claim 15, wherein the W-based alloy is selected from the group consisting of $W_{1-x}Cr_x$ and $W_{1-x-y}Cr_xM_y$, wherein M is metal element.

17. The embedded passive device structure of claim 16, wherein the M is selected from the group consisting of cooper (Cu), molybdenum (Mo), vanadium (V), tungsten (W), iron (Fe), aluminum (Al), and titanium (Ti).

18. The embedded passive device structure of claim 13, wherein the Ni-based compound is selected from the group consisting of $Ni_{1-x-z}Cr_xN_z$ and $Ni_{1-x-y}W_xN_z$, wherein N is nonmetallic element.

19. The embedded passive device structure of claim 18, wherein the Cr-based compound is selected from the group consisting of $Cr_{1-x-z}W_xN_z$, wherein N is nonmetallic element.

20. The embedded passive device structure of claim 19, wherein the W-based compound is selected from the group consisting of $W_{1-x-z}Cr_xN_z$, wherein N is nonmetallic element.

21. The embedded passive device structure of claim 20, wherein the N is selected from the group consisting of boron (B), carbon (C), nitrogen (N), oxygen (O), and silicon (Si).

* * * * *